United States Patent
Cheng et al.

(10) Patent No.: US 10,903,365 B2
(45) Date of Patent: Jan. 26, 2021

(54) TRANSISTORS WITH UNIFORM SOURCE/DRAIN EPITAXY

(71) Applicant: International Business Machines Corporation, Armonk, NY (US)

(72) Inventors: Kangguo Cheng, Schenectady, NY (US); Ruilong Xie, Niskayuna, NY (US); Chun-Chen Yeh, Danbury, CT (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/445,823

(22) Filed: Jun. 19, 2019

(65) Prior Publication Data

US 2020/0403099 A1    Dec. 24, 2020

(51) Int. Cl.
*H01L 29/78*    (2006.01)
*H01L 21/02*    (2006.01)
(Continued)

(52) U.S. Cl.
CPC .... *H01L 29/7851* (2013.01); *H01L 21/02532* (2013.01); *H01L 21/823412* (2013.01); *H01L 21/823431* (2013.01); *H01L 21/823437* (2013.01); *H01L 21/823468* (2013.01); *H01L 27/0886* (2013.01); *H01L 29/0673* (2013.01); *H01L 29/165* (2013.01); *H01L 29/6653* (2013.01); *H01L 29/6681* (2013.01); *H01L 29/66545* (2013.01); *H01L 29/775* (2013.01)

(58) Field of Classification Search
CPC ............. H01L 29/7851; H01L 29/0673; H01L 29/165; H01L 29/6653; H01L 29/66545; H01L 29/6681; H01L 29/775; H01L 21/02532; H01L 21/823412; H01L 21/83431; H01L 21/823437; H01L 21/823468; H01L 27/0886
USPC ........................................................ 257/288
See application file for complete search history.

(56) References Cited

U.S. PATENT DOCUMENTS 9,287,357 B2    3/2016 Rodder et al.
9,536,877 B2    1/2017 Cai et al.
(Continued)

OTHER PUBLICATIONS

Loubet et al., "Stacked Nanosheet Gate-All-Around Transistor to Enable Scaling Beyond FinFET," Symposium on VLSI Technology Digest of Technical Papers, Jun. 2017, pp. T230-T-231.

*Primary Examiner* — Tu-Tu V Ho
(74) *Attorney, Agent, or Firm* — Douglas Pearson; Ryan, Mason & Lewis, LLP

(57) ABSTRACT

A method for manufacturing a semiconductor device includes forming a plurality of semiconductor layers on a semiconductor substrate, and forming a plurality of gate structures spaced apart from each other on the semiconductor layers. The semiconductor layers are patterned into a plurality of patterned stacks spaced apart from each other, wherein the plurality of patterned stacks are under the plurality of gate structures. The method also includes forming a plurality of sacrificial spacers on lateral sides of the plurality of gate structures, and growing a plurality of source/drain regions. The source/drain regions are adjacent the patterned stacks and include a plurality of pillar portions formed on lateral sides of the sacrificial spacers. The sacrificial spacers and the plurality of pillar portions are removed.

17 Claims, 12 Drawing Sheets

(51) Int. Cl.
*H01L 29/66* (2006.01)
*H01L 29/165* (2006.01)
*H01L 21/8234* (2006.01)
*H01L 29/06* (2006.01)
*H01L 27/088* (2006.01)
*H01L 29/775* (2006.01)

(56) References Cited

U.S. PATENT DOCUMENTS

| | | |
|---|---|---|
| 9,991,352 B1 | 6/2018 | Frougier et al. |
| 10,074,730 B2 * | 9/2018 | Bergendahl ......... H01L 29/6656 |
| 2016/0071729 A1 | 3/2016 | Hatcher et al. |
| 2016/0111421 A1 | 4/2016 | Rodder et al. |
| 2018/0047832 A1 | 2/2018 | Tapily et al. |
| 2018/0240875 A1 | 8/2018 | Gluschenkov et al. |
| 2018/0254329 A1 | 9/2018 | Guillorn et al. |
| 2018/0308758 A1 | 10/2018 | Willemann |

* cited by examiner

TRANSISTORS WITH UNIFORM SOURCE/DRAIN EPITAXY

BACKGROUND

Transistor devices may be, for example, fin field-effect transistor (FinFET), nanosheet or nanowire devices. For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer improved electrostatics and higher current density per footprint area than FinFETs. Nanosheet or nanowire formation relies on the selective removal of one semiconductor (e.g., SiGe) with respect to another (Si) to form the nanosheet/nanowire and GAA structures.

In existing approaches, epitaxially grown source/drain regions having non-uniform heights leads to increased device variability. Accordingly, there is a need for techniques and structures to prevent non-uniformity between epitaxially grown source/drain regions.

SUMMARY

According to an exemplary embodiment of the present invention, a method for manufacturing a semiconductor device includes forming a plurality of semiconductor layers on a semiconductor substrate, and forming a plurality of gate structures spaced apart from each other on the semiconductor layers. The semiconductor layers are patterned into a plurality of patterned stacks spaced apart from each other, wherein the plurality of patterned stacks are under the plurality of gate structures. A plurality of sacrificial spacers are formed on lateral sides of the plurality of gate structures, and a plurality of source/drain regions are grown. The source/drain regions are adjacent the patterned stacks and include a plurality of pillar portions formed on lateral sides of the sacrificial spacers. The method also includes selectively removing the plurality of sacrificial spacers, and removing the plurality of pillar portions.

According to an exemplary embodiment of the present invention, a semiconductor device includes a plurality of stacked structures spaced apart from each other on a substrate. The plurality of stacked structures each include a plurality of gate structures and a plurality of channel layers. A plurality of epitaxial source/drain regions extend from the plurality of channel layers, and the plurality of epitaxial source/drain regions have the same or substantially the same height as each other.

According to an exemplary embodiment of the present invention, a method for manufacturing a semiconductor device includes forming a plurality of first semiconductor layers and a plurality of second semiconductor layers on a semiconductor substrate in a stacked configuration. The stacked configuration includes a repeating arrangement of a second semiconductor layer stacked on a first semiconductor layer. A plurality of gate structures are formed to be spaced apart from each other on the stacked configuration, and the stacked configuration is patterned into a plurality of patterned stacks spaced apart from each other under the plurality of gate structures. A plurality of sacrificial spacers are formed on lateral sides of the plurality of gate structures, and a plurality of source/drain regions are grown from the plurality of second semiconductor layers. The plurality of source/drain regions are adjacent the plurality of patterned stacks and include a plurality of pillar portions formed on lateral sides of the plurality of sacrificial spacers. The method also includes selectively removing the plurality of sacrificial spacers, and removing the plurality of pillar portions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
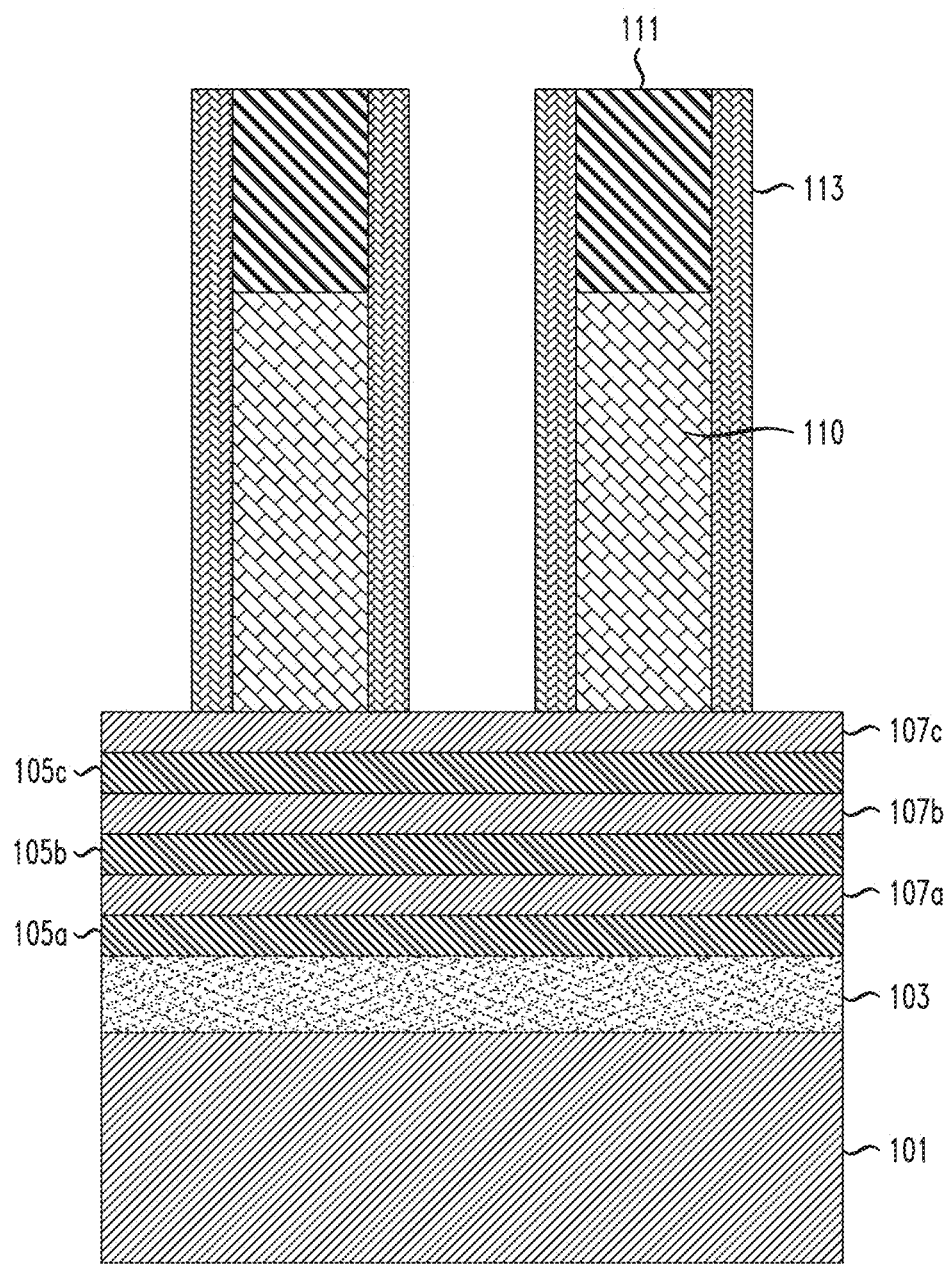
FIG. 1 is a schematic cross-sectional view illustrating manufacturing of a semiconductor device and showing formation of a stacked structure of silicon germanium (SiGe) and silicon (Si) nanosheet layers, and formation of dummy gate structures and spacers on a semiconductor substrate, according to an embodiment of the invention.

Exemplary embodiments of the invention will now be discussed in further detail with regard to semiconductor devices and methods of manufacturing same and, in particular, to formation of uniform epitaxial source/drain regions by removing epitaxial pillar regions.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Although embodiments of the present invention are discussed in connection with nanosheet stacks, the embodiments of the present invention are not necessarily limited thereto, and may similarly apply to nanowire stacks and FinFETs.

FIG. 1 is a schematic cross-sectional view illustrating manufacturing of a semiconductor device and showing formation of a stacked structure of silicon germanium (SiGe) and silicon (Si) nanosheet layers, and formation of dummy gate structures and spacers on a semiconductor substrate, according to an embodiment of the invention. Referring to FIG. 1, a semiconductor substrate 101 comprises semiconductor material including, but not limited to, silicon (Si), silicon germanium (SiGe), III-V, II-V compound semiconductor or other like semiconductor. In addition, multiple layers of the semiconductor materials can be used as the semiconductor material of the substrate.

In accordance with an embodiment of the present invention, if the substrate 101 comprises a bulk silicon substrate, a layer of SiGe 103 is formed on the substrate 101 to form a region where an isolation layer will subsequently be formed. The SiGe layer 103 can be formed by epitaxial growth, and can include SiGe having, for example, a Si concentration of 40% and a Ge concentration of 60%. However, other ratios of Si to Ge may be used, such as, for example, 50% Si and 50% Ge. Alternatively, if a silicon-on-insulator (SOI) substrate is used, the SiGe layer 103 can be omitted.

Layers of silicon germanium 105a, 105b and 105c and silicon 107a, 107b and 107c are epitaxially grown in an alternating and stacked configuration on the SiGe layer 103, so that a first SiGe layer 105a is followed a first Si layer 107a on the first SiGe layer 105a, which is followed by a second SiGe layer 105b on the first Si layer 107a, and so on. As can be understood, the first SiGe layer 105a is epitaxially grown from the SiGe layer 103, and subsequent layers are epitaxially grown from their corresponding underlying layers in the stack.

While three SiGe layers 105a-c and three Si layers 107a-c are shown, the embodiments of the present invention are not necessarily limited to the shown number of layers 105, 107, and there may be more or less layers in the same alternating configuration depending on design constraints. According to an embodiment, the three SiGe layers 105a-c include SiGe having, for example, a Si concentration of 75% and a Ge concentration of 25%. However, other ratios of Si to Ge may be used, as long as they have a different concentration of germanium than that of SiGe layer 103 so that SiGe layer 103 can be selectively removed with respect to the SiGe layers 105a-c. For example, SiGe layer 103 has a higher Ge % than SiGe layers 105a-c so it can be etched selectively with respect to SiGe layers 105a-c. Alternatively, the SiGe layers 105a-c may include SiGe with 80% Si and 20% Ge.

Although SiGe is described as the sacrificial material for layers 105-a-c, and Si is described as the nanosheet channel material for layers 107a-c, other materials can be used. For example, Ge can be used as sacrificial material for layers 105-a-c and gallium arsenide (GaAs) can be used as the nanosheet channel material for layers 107a-c.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

As noted, in a non-limiting illustrative embodiment, SiGe layers 105a-105c of a SiGe/Si nanosheet stack are formed on the SiGe layer 103 and Si channel layers 107a-107c are formed on the SiGe layers 105a-105c by epitaxial growth. Alternative materials may be used that have the property of being removed selectively compared to the nanosheet channel material, which, according to an embodiment, is silicon (e.g., layers 107a-107c).

In a non-limiting illustrative embodiment, a height of the layers 105a, 105b and 105c can be in the range of about 6 nm to about 15 nm depending on the application of the device. Also, in a non-limiting illustrative embodiment, silicon layers 107a-107c of the SiGe/Si nanosheet stack can be formed on SiGe layers 105a-105c by epitaxial growth. In accordance with an embodiment of the present invention, the layers 107a-107c can include the same or a similar composition to the substrate 101. In a non-limiting example, a height of the layers 107a-107c can be in the range of about 6 nm to about 15 nm depending on the desired process and application. In accordance with an embodiment of the present invention, each of the layers 107a-107c has the same or substantially the same composition and size as each other, and each of the layers 105a-105d has the same or substantially the same composition and size as each other.

As depicted in FIG. 1, a dummy gate structure including gate material and hardmask layers 110 and 111 is deposited on and around the stacked configuration of Si and SiGe. The gate structure is a dummy gate structure for nanosheet or nanowire devices. However, the gate structure can be a dummy or real gate structure for FinFET devices. For ease of explanation, the gate structure including the gate material and hardmask layers 110 and 111 is referred to herein as a dummy gate structure.

The gate material layer 110, includes, but is not necessarily limited to, polysilicon, amorphous silicon, with a dielectric material such as, for example, oxide or silicon nitride underneath of the polysilicon or amorphous silicon. The gate material layer is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical polishing (CMP), and lithography and etching steps to remove excess gate material, and pattern the deposited layers into the gate material layers 110 corresponding to what is to become device gate regions. The dummy gate structure further comprise a hardmask layer 111.

Spacer layers 113 are formed on top of and on sides of the dummy gate structures, and can be formed by one or more of the deposition techniques noted in connection with deposition of the gate material. The spacer and hardmask material can comprise for example, one or more dielectrics, including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. Spacers can be formed by any suitable techniques such as deposition followed by directional etching. Deposition may include but is not limited to, ALD or CVD. Directional etching may include but is not limited to, reactive ion etch (RIE).

According to an example embodiment of the invention, the spacer layers 113 are deposited on sidewalls and the hardmask layers 111 on top surfaces of the gate material layers 110. In accordance with an embodiment of the present invention, the spacer and hardmask materials may be the same as or different from each other.

Figure 2:
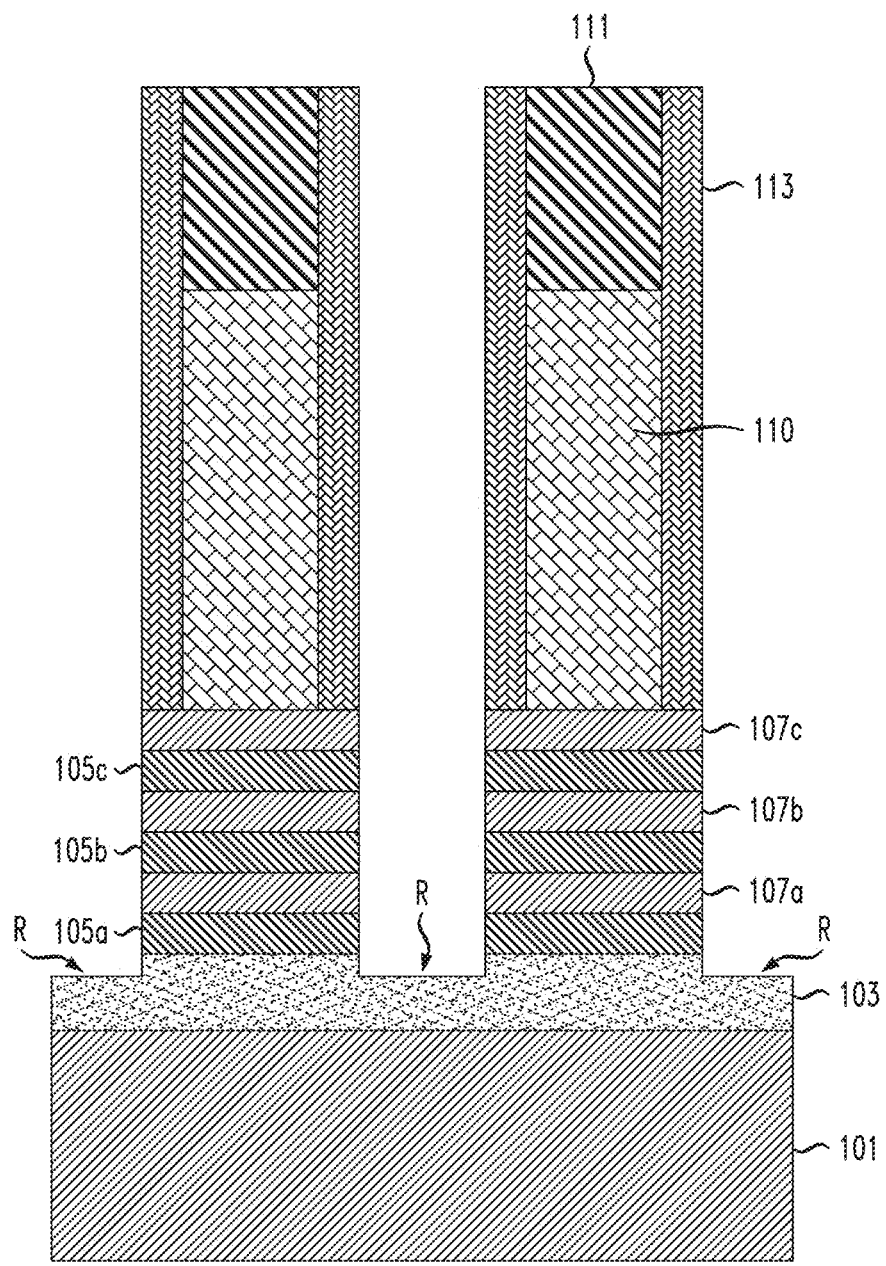
FIG. 2 is a schematic cross-sectional view illustrating manufacturing of a semiconductor device and showing patterning of the stacked nanosheet layers, according to an embodiment of the invention.

FIG. 2 is a schematic cross-sectional view illustrating manufacturing of a semiconductor device and showing patterning of the stacked nanosheet layers, according to an embodiment of the invention. Referring to FIG. 2, exposed portions of the stacked nanosheet layers, which are not under the spacer and gate material layers 113 and 110, are removed using, for example, an etching process, such as reactive ion etching (RIE). As can be seen in FIG. 2, the portions of the stacked nanosheets or nanowires under the spacer layers 113 and under the gate material layers 110 remain after the etching process, and portions of the stacked nanosheets or nanowires in areas that correspond to where source/drain regions will be formed are removed. For ease of explanation, two dummy gate structures and nanosheet stacks are shown. However, the embodiments are not limited thereto, and more than two dummy gate structures and corresponding nanosheet stacks can be formed on a substrate 101.

Referring to FIG. 2, portions of the SiGe layer 103 are etched during the patterning to form recessed portions R in the SiGe layer 103. In a non-limiting illustrative example, a depth of the recessed portions is about 10 nm to about 25 nm. Although shown as horizontal surfaces, in accordance with an embodiment, the bottom surfaces of the recessed portions of the SiGe layer 103 may be formed in a concave curved shape.

Figure 3:
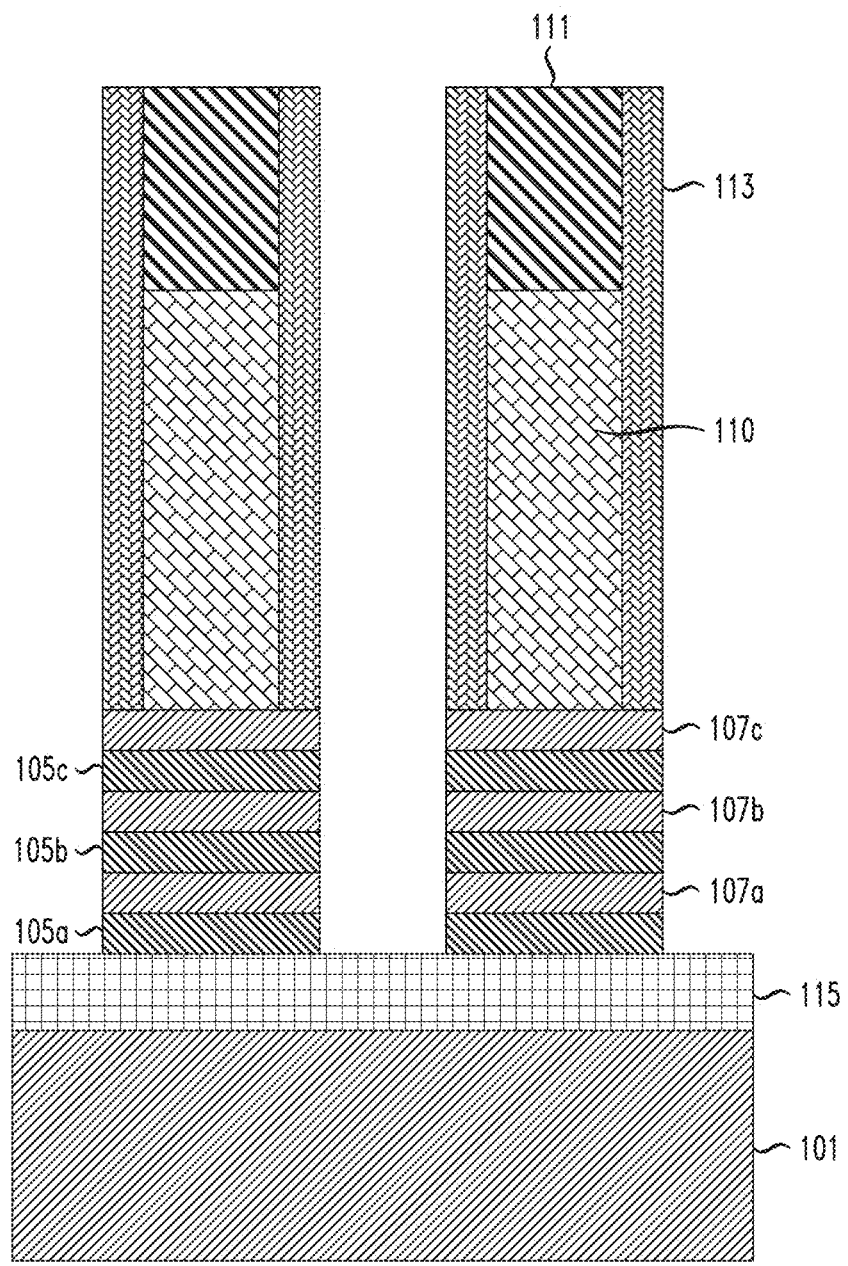
FIG. 3 is a schematic cross-sectional view illustrating manufacturing of a semiconductor device and showing formation of a bottom isolation layer, according to an embodiment of the invention.

FIG. 3 is a schematic cross-sectional view illustrating manufacturing of a semiconductor device and showing formation of a bottom isolation layer, according to an embodiment of the invention. Referring to FIG. 3, the SiGe layer 103 is removed using, for example, an aqueous solution containing ammonium hydroxide ($NH_4OH$) and hydrogen peroxide ($H_2O_2$) or a gas containing hydrogen fluoride (HCl). Following the removal of the SiGe layer 103, a dielectric layer is deposited using deposition techniques such as, for example, CVD, PECVD, RFCVD, PVD, ALD, MBD, PLD and/or LSMCD, followed by an etch back to form a bottom isolation layer 115 on the substrate 101. For example, SiN can be etched back by using hot phosphoric acid. The bottom isolation layer 115 may comprise, for example, $SiO_x$, silicon oxycarbide (SiOC), silicon oxycarbonitride (SiOCN) or some other dielectric.

Figure 4:
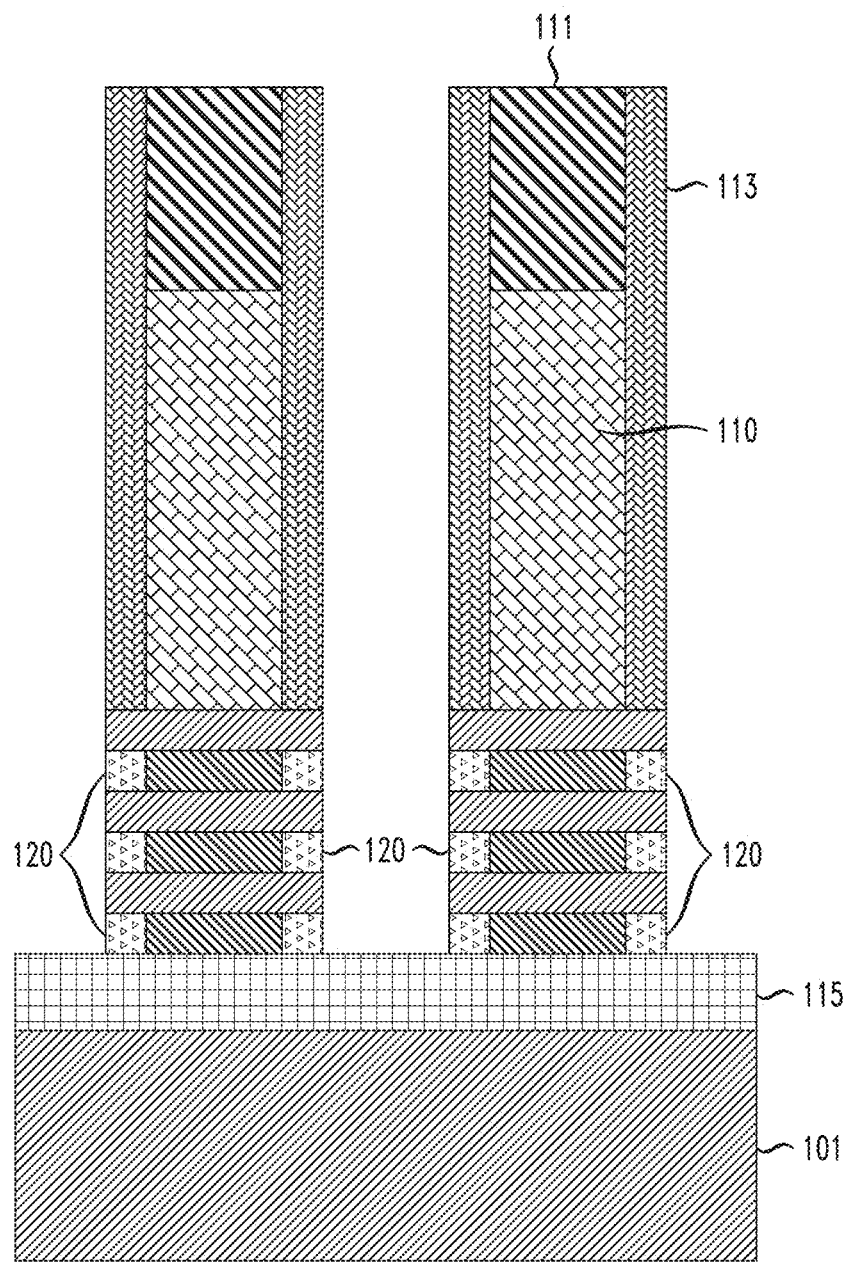
FIG. 4 is a schematic cross-sectional view illustrating manufacturing of a semiconductor device and showing lateral recessing of SiGe layers and formation of inner spacers, according to an embodiment of the invention.

FIG. 4 is a schematic cross-sectional view illustrating manufacturing of a semiconductor device and showing lateral recessing of SiGe layers and formation of inner spacers, according to an embodiment of the invention. As shown in FIG. 4, due to the germanium in layers 105a-105c, lateral etching of the layers 105a-105c can be performed selective to layers 107a-107c, such that the side portions of the SiGe layers 105a-105c can be removed to create vacant areas to be filled in by inner spacers 120, while maintaining the side portions of layers 107a-107c. Such etching can be performed using, for example, $NH_4OH$:$H_2O_2$ solution.

An inner spacer layer is deposited on top and side surfaces of the nanosheet stacks, as well on exposed surfaces of the isolation layer 115. In accordance with an embodiment, the inner spacer layer can comprise, but is not necessarily limited to, a dielectric, such as a nitride, like silicon nitride (SiN). The inner spacer layer can comprise the same material as or a different material from that of the spacer layers 113.

In accordance with an embodiment of the present invention, the vacant portions left by removal of the side portions of the layers 105a-105c are filled in by portions of the inner spacer layer formed on side surfaces of the nanosheet stacks to form the inner spacers 120. Deposition of the inner spacer layer can be performed using a deposition technique including, but not necessarily limited to, ALD.

Portions of the inner spacer layer are removed from horizontal surfaces, including from the top of the spacer and hardmask layers 113, 111 on the nanosheet stacks and from the isolation layer 115. In addition, portions of the inner spacer layer on sides of the nanosheet stacks and on sides of the spacer layers 113 are also removed, leaving the inner spacers 120. In a non-limiting illustrative example, at least one embodiment of the invention includes using a removal process, such as a gas cluster ion beam (GCIB) process to perform the removal of the portions of the inner spacer layer.

Figure 5:
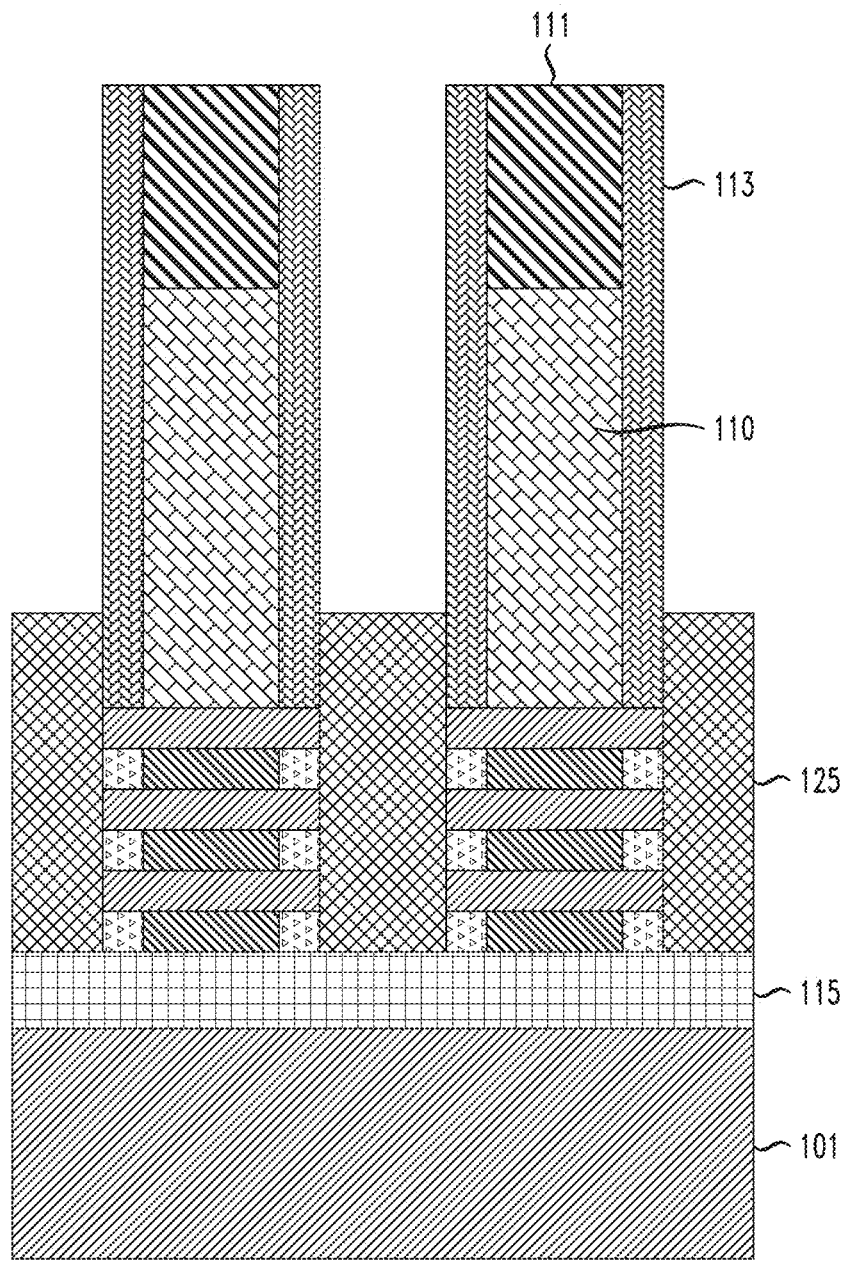
FIG. 5 is a schematic cross-sectional view illustrating manufacturing of a semiconductor device and showing formation of a sacrificial organic planarization layer (OPL), according to an embodiment of the invention.

FIG. 5 is a schematic cross-sectional view illustrating manufacturing of a semiconductor device and showing formation of a sacrificial organic planarization layer (OPL), according to an embodiment of the invention. In accordance with an embodiment of the present invention, a sacrificial OPL 125 is formed on exposed portions of the isolation layer 115 adjacent the nanosheet stacks including the gate material layers 110, hardmask layers 111 and spacer layers 113 thereon. The OPL 125 can be deposited, for example, by spin coating, followed by a removal process to recess the OPL 125 to a desired height on the isolation layer 115. According to one or more embodiments, the OPL 125 is recessed to a height of about 30 nm to about 60 nm below the top of the hardmask layer 111, and the recessing is performed using a wet or dry etching process that is selective with respect to materials of the hardmask and spacer layers 111 and 113. Etch chemistry for recessing the OPL 125 can include, for example, oxygen plasma or a plasma containing nitrogen ($N_2$))/hydrogen ($H_2$).

As can be seen in FIG. 5, a resulting height of the OPL 125 is above the uppermost silicon layers 107c of the nanosheet stacks, and extends level with a lower region of the gate material layers 110. The OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art.

Figure 6:
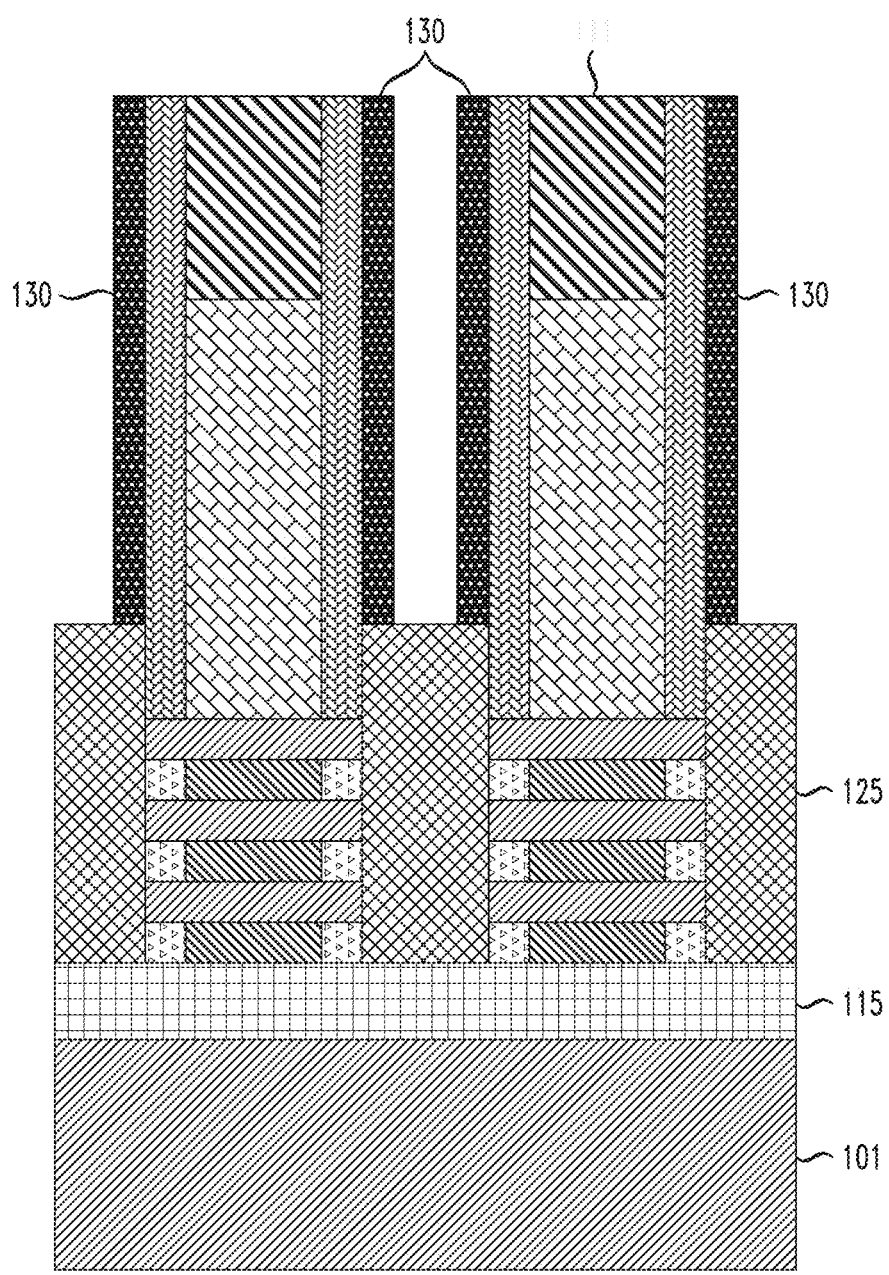
FIG. 6 is a schematic cross-sectional view illustrating manufacturing of a semiconductor device and showing formation of sacrificial spacer layers, according to an embodiment of the invention.

FIG. 6 is a schematic cross-sectional view illustrating manufacturing of a semiconductor device and showing formation of sacrificial spacer layers 130, according to an embodiment of the invention. A sacrificial spacer layer is deposited on top and side surfaces of the spacer and hardmask layers 113 and 111, as well on exposed surfaces of the OPL 125. In accordance with an embodiment, the sacrificial spacer layer can comprise, but is not necessarily limited to, a dielectric, such as a nitride, like SiN. Deposition of the sacrificial spacer layer can be performed using a deposition technique including, but not necessarily limited to, ALD.

Portions of the sacrificial spacer layer are removed from horizontal surfaces, including from the top of the spacer and hardmask layers 113, 111 and from portions of the OPL 125, leaving the sacrificial spacers 130 on lateral sides of the spacer layers 113. In one or more embodiments, a directional reactive ion etching (RIE) process is used to remove the horizontal portions of the sacrificial spacer layer. A thickness of the sacrificial spacers 130 on the spacer layers 113 is about 3 nm to about 6 nm, although other thicknesses are also possible.

Figure 7:
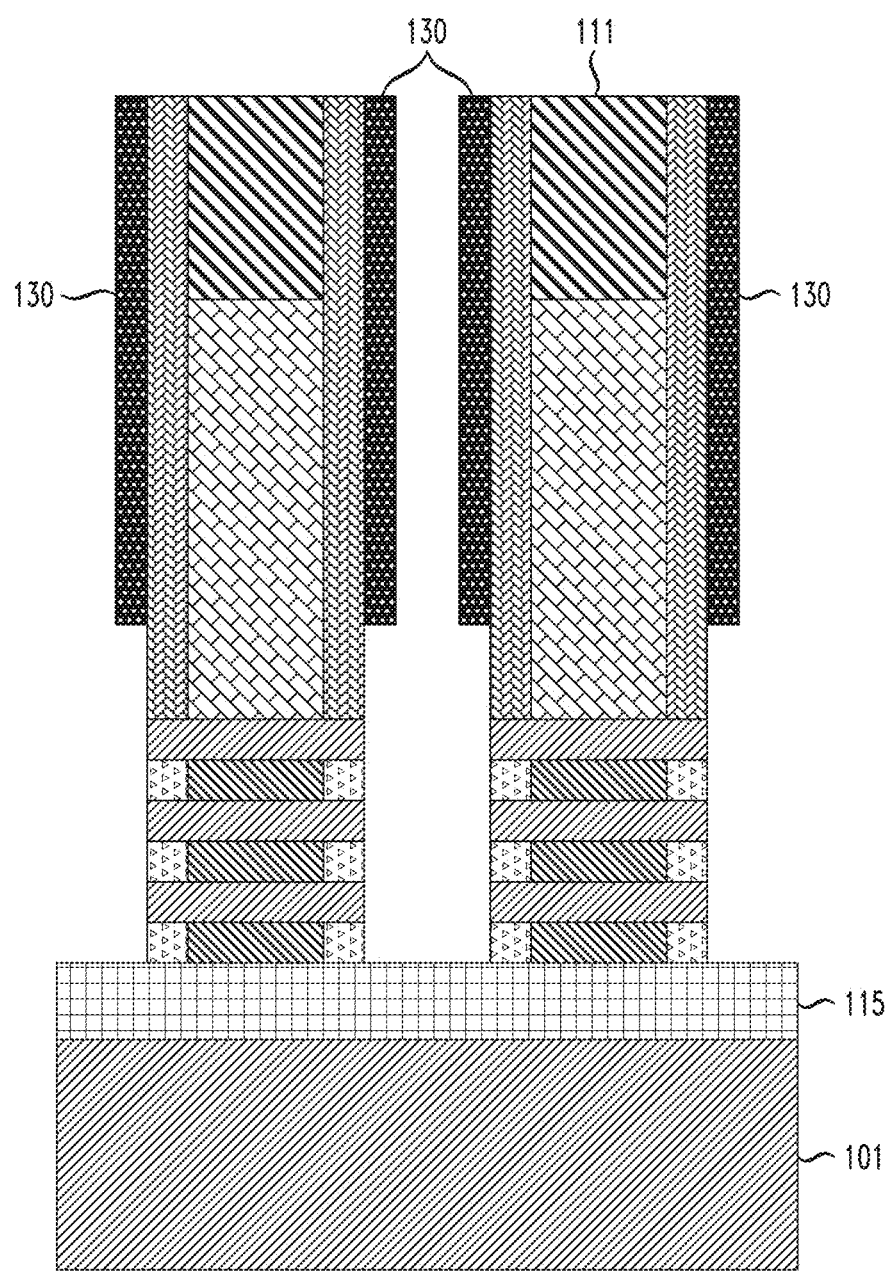
FIG. 7 is a schematic cross-sectional view illustrating manufacturing of a semiconductor device and showing removal of the OPL, according to an embodiment of the invention.

FIG. 7 is a schematic cross-sectional view illustrating manufacturing of a semiconductor device and showing removal of the sacrificial OPL 125, according to an embodiment of the invention. Referring to FIG. 7, the OPL 125 is stripped using, for example, oxygen plasma, nitrogen/hydrogen plasma or other carbon strip process. OPL stripping causes minimal or no damage to exposed layers.

Figure 8:
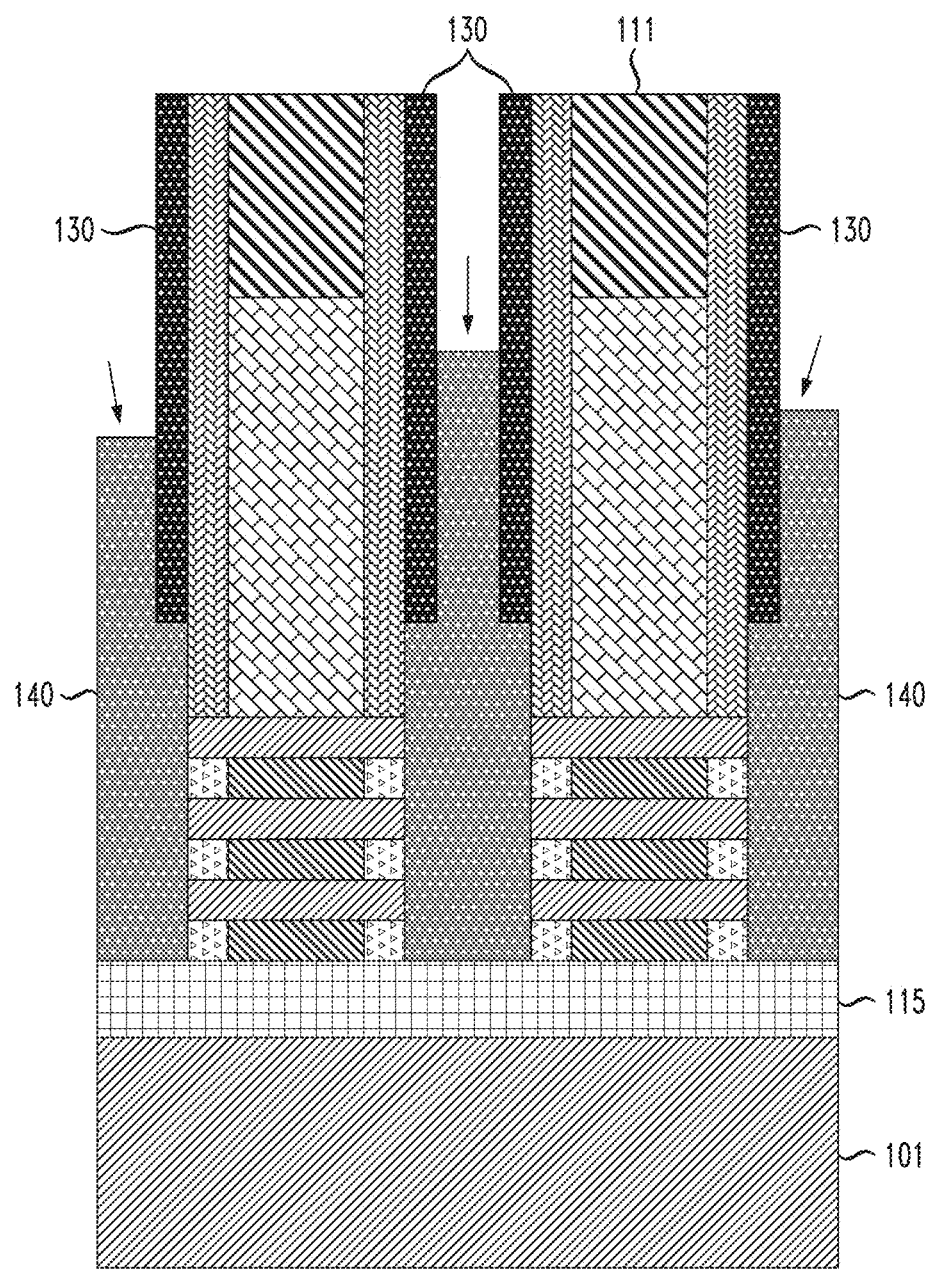
FIG. 8 is a schematic cross-sectional view illustrating manufacturing of a semiconductor device and showing epitaxial growth of source/drain regions, according to an embodiment of the invention.

FIG. 8 is a schematic cross-sectional view illustrating manufacturing of a semiconductor device and showing epitaxial growth of source/drain regions 140, according to an embodiment of the invention. Referring to FIG. 8, epitaxial source/drain regions 140 are grown from exposed sides of the silicon layers 107a-107c of the nanosheet stacks. According to a non-limiting embodiment of the present invention, the conditions of the epitaxial growth process for the source/drain regions 140 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure range of about 450° C. to about 800° C., and about 5 Torr-about 300 Torr.

Side portions of the SiGe layers 105a-105c are covered with the inner spacers 120 during the epitaxial growth of the source/drain regions 140, and lateral epitaxial growth does not occur from the SiGe layers 105a-105c of the patterned stacks.

After further processing, the epitaxial source/drain regions 140 become the source/drain regions for transistor devices, such as, for example, NFETs or PFETs, and can comprise in-situ phosphorous doped (ISPD) Si or Si:C for n-type devices, or in-situ boron doped (ISBD) SiGe for p-type devices, at concentrations of about $1 \times 10^{19}/cm^3$ to about $3 \times 10^{21}/cm^3$. By "in-situ," it is meant that the dopant that dictates the conductivity type of the doped layer is introduced during the process step, e.g., epitaxial deposition, which forms the doped layer.

As shown by the arrows in FIG. 8, the epitaxial growth process results in source/drain regions 140 having different (non-uniform) heights. The heights of the source/drain regions 140 extend above a top surface of the uppermost Si layer 107c to correspond with the gate material layers 110. As can be seen in FIG. 8, due to the sacrificial spacers 130, a lateral width of pillar portions P (see FIG. 9) of the source/drain regions 140 adjacent and/or between the sacrificial spacers 130 is less than a lateral width of the portions of the source/drain regions 140 where no sacrificial spacers 130 are formed (i.e., immediately adjacent the spacer layers 113 and the layers of the nanosheet stacks under the gate material layers 110 below the spacer layers 113).

Figure 9:
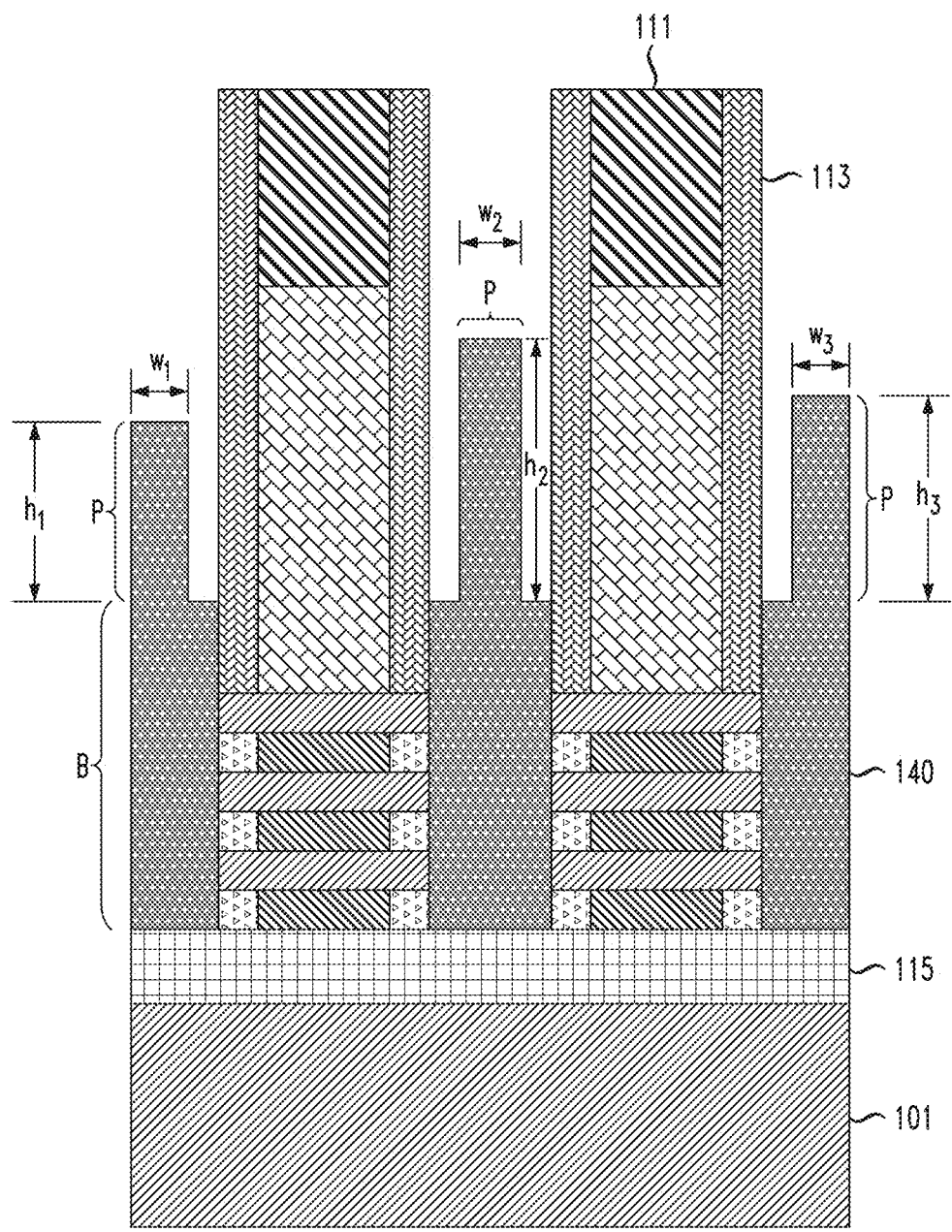
FIG. 9 is a schematic cross-sectional view illustrating manufacturing of a semiconductor device and showing sacrificial spacer layer removal, according to an embodiment of the invention.

FIG. 9 is a schematic cross-sectional view illustrating manufacturing of a semiconductor device and showing sacrificial spacer layer removal, according to an embodiment of the invention. Referring to FIG. 9, the sacrificial spacers 130 are removed using for example, in the case of sacrificial spacers 130 comprising SiN, a plasma etching process containing oxygen and $CF_4$. The removal of the sacrificial spacers 130 is selective to the epitaxial source/drain regions 140 and exposes sidewalls of the pillar portions P of the epitaxial source/drain regions 140. The pillar portions P have different heights due to non-uniform epitaxial growth. A vertical height ($h_1$, $h_2$ and $h_3$) of each pillar portion P with respect to the underlying base portions B of the source/drain regions 140 is greater than a corresponding lateral width ($w_1$, $w_2$, $w_3$) the pillar portion P. Due to non-uniform epitaxial growth, the vertical heights ($h_1$, $h_2$ and $h_3$) of the pillar portions P will be different from each other. However, in some cases, two or more of the vertical heights ($h_1$, $h_2$ and $h_3$) may be the same. The lateral widths ($w_1$, $w_2$, $w_3$) of the pillar portions P may be the same or substantially the same as each other (e.g., ±≤5 nm). According to one or more embodiments, when the lateral widths ($w_1$, $w_2$, $w_3$) are, for example, about 10 nm, vertical heights ($h_1$, $h_2$ and $h_3$) of the pillars P may be about 20 to about 30 nm, but the embodiments are not limited thereto. In relatively longer channel FETs (see FIG. 12) having wider source/drain regions, when the lateral widths ($w_1$, $w_2$, $w_3$) are, for example, about 20 nm, vertical heights ($h_1$, $h_2$ and $h_3$) of the pillars P may be about 30 to about 40 nm, but the embodiments are not limited thereto.

Figure 10:
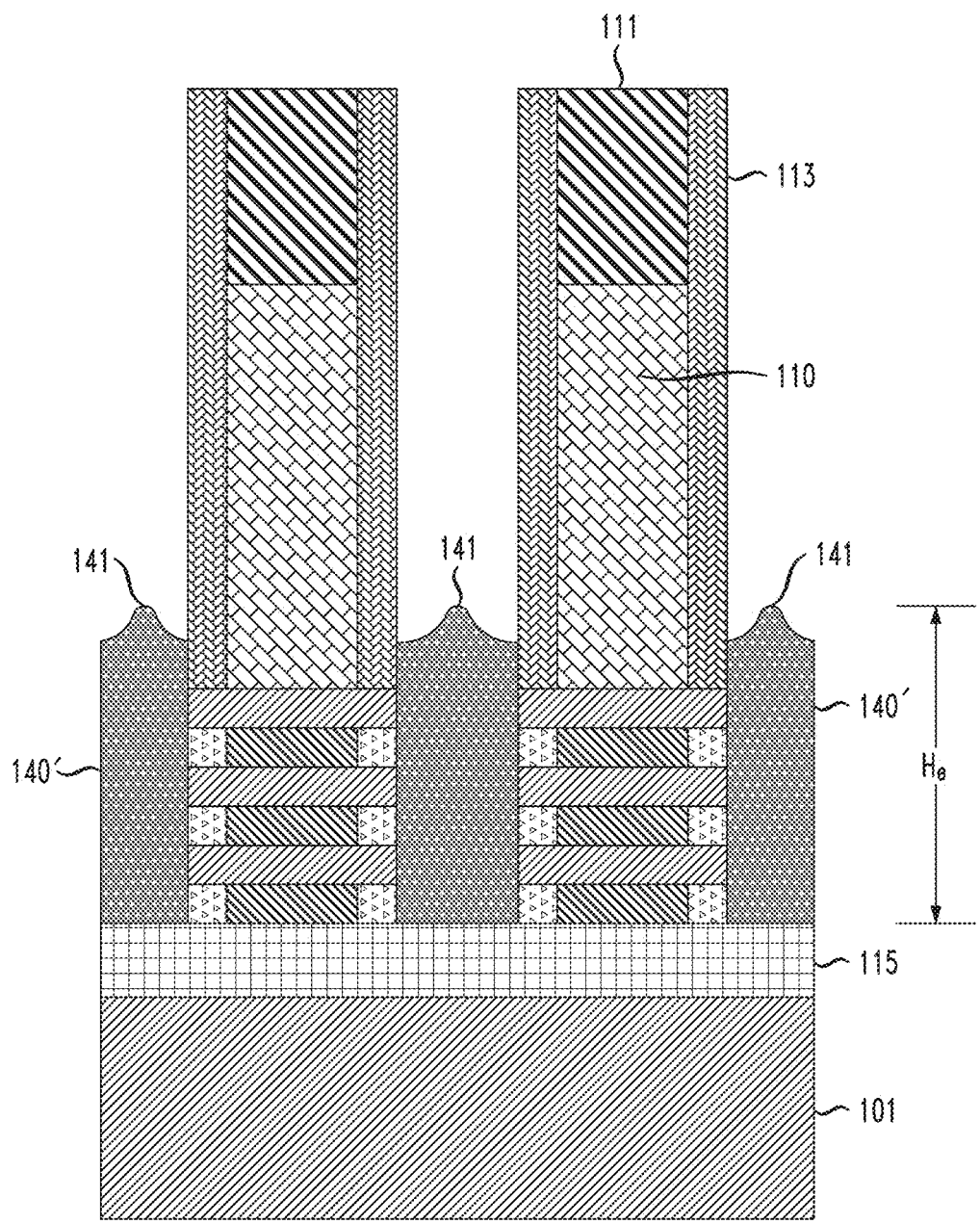
FIG. 10 is a schematic cross-sectional view illustrating manufacturing of a semiconductor device and showing removal of epitaxial pillar portions, according to an embodiment of the invention.

FIG. 10 is a schematic cross-sectional view illustrating manufacturing of a semiconductor device and showing removal of epitaxial pillar portions P to form patterned source/drain regions 140'. Referring to FIG. 10, isotropic etching is performed to remove the epitaxial pillar portions P. The multi-directional (isotropic) etching attacks the pillar portions P on all exposed sides. As long as the vertical heights ($h_1$, $h_2$ and $h_3$) of the pillars P are greater than their corresponding widths ($w_1$, $w_2$, $w_3$), the epitaxial pillar portions P can be removed with a timed etch targeting slightly more than half of the pillar width. For example, in the case of Si pillars, the isotropic etch is performed with plasma containing $SF_6$, or by wet etching with ammonia. In the case of SiGe pillars, the isotropic etch is performed with gas containing HCl, or by wet etching with a mix of ammonia and hydrogen peroxide, which selectively etches the source/drain epitaxial material with respect to the material of the spacer and the hardmask layers 113, 111.

The non-uniform heights of the source/drain regions 140 are eliminated with the removal of the non-uniform pillar portions P, to result in patterned source/drain regions 140'. Due to the vertical heights of the pillars P being greater than their lateral widths, although etching also occurs from the top surface of the pillars P in addition to the side surfaces, the etching from the side removes the pillars P at the same time or substantially the same time. As a result, the remaining patterned source drain regions 140' have the same or substantially the same heights (He). The patterned source/drain regions 140' include the base portions B, and epitaxial profile portions 141 formed after the isotropic etching of the pillars P. According to an embodiment, as can be seen in FIG. 10, the profile portions 141 have a curved parabolic/bell-curve like shape of an upper surface of each of the patterned source/drain regions 140', and the heights (He) of each of the patterned epitaxial source/drain regions 140' are the same or substantially the same (e.g., ±≤5 nm). The profile portions 141 each have a central portion having a greater height than that of portions on opposite sides of the central portion.

Figure 11:
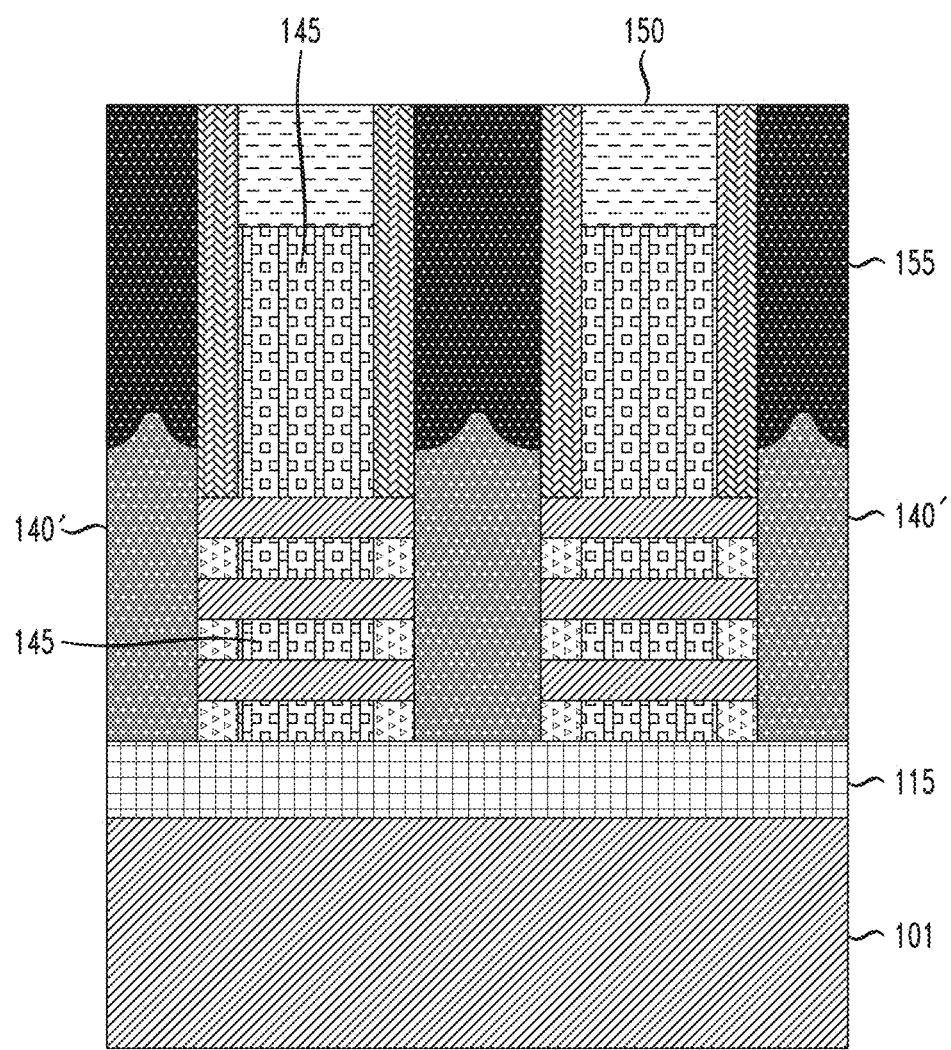
FIG. 11 is a schematic cross-sectional view illustrating manufacturing of a semiconductor device and showing a structure after dummy gate structure and SiGe layer removal and formation of replacement gates and source/drain contacts, according to an embodiment of the invention.

FIG. 11 is a schematic cross-sectional view illustrating manufacturing of a semiconductor device and showing a structure after dummy gate structure and SiGe layer removal and formation of replacement gate structures and source/drain contacts, according to an embodiment of the invention. Referring to FIG. 11, the gate material layers 110 and SiGe layers 105a-105c are selectively removed to create vacant areas where gate material layers 110 and SiGe layers 105a-105c were removed. Then, the silicon nanosheets or nanowires 107a-107c are suspended, and the gate structure, including, for example, gate and dielectric portions are formed in place of the gate material layers 110 and SiGe layers 105a-105c. The selective removal can be performed using wet or dry chemistries selective to Si. In non-limiting examples, $CH_3COOH:H_2O_2:HF$ or $CF_4/O_2$ based chemistries can be used. Various other etch chemistries may be used. The hardmask layers 111 are also removed.

In accordance with an embodiment of the present invention, replacement gate structures 145 are formed in the vacant areas where the gate material layers 110 and SiGe layers 105a-105c were removed. Each replacement gate structure 145 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the replacement gate structures 145 each include a gate region including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer.

Self-aligned cap (SAC) layers 150 are formed on the uppermost replacement gate structures 145 between the spacer layers 113, and can include, for example, a nitride such as, but not necessarily limited to, SiN, SiBN, SiBCN, BN or other dielectric. In one or more embodiments of the invention, the layers for the gate structures 145 and the SAC layers 150 can be deposited using, for example, CVD, PECVD, RFCVD, PVD, ALD, MLD, MBD, PLD, LSMCD, and/or sputtering, followed by planarization by, for example, CMP.

Source/drain contacts 155 are formed over the patterned source/drain regions 140' and contact the profile portions 141 of the patterned source/drain regions 140'. According to an embodiment, the source/drain contacts 155 wrap around the curved profile portions 141, which increases contact area and reduces contact resistance relative to contacts on conventionally formed source/drain regions, which do not include the curved profile portions 141. A material of the source/drain contacts 155 includes, for example, electrically conductive material such as, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of trenches formed in an inter-layer dielectric (ILD) layer (not shown) and on the source/drain regions 140' before filling the trenches with the contact material. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Figure 12:
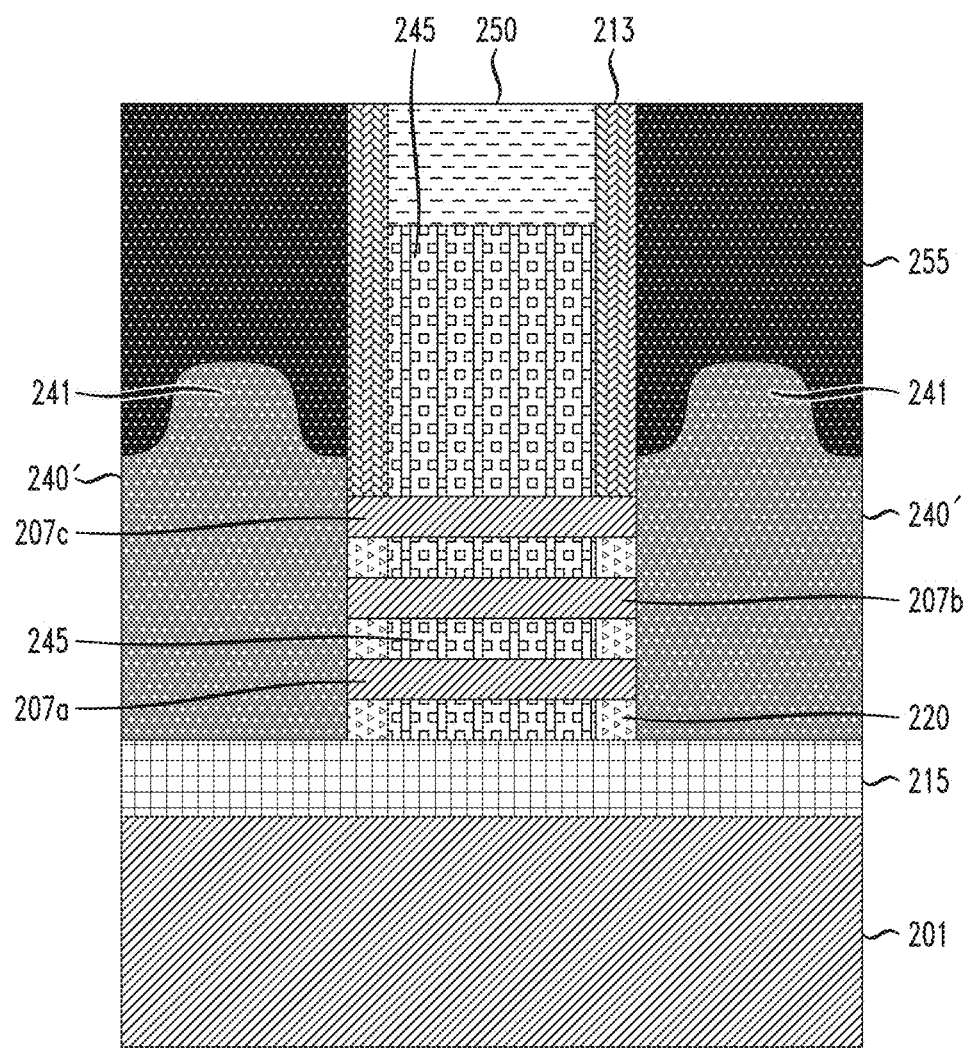
FIG. 12 is a schematic cross-sectional view illustrating a semiconductor device with wider epitaxial source/drain regions, according to an embodiment of the invention.

FIG. 12 is a schematic cross-sectional view illustrating a semiconductor device with wider epitaxial source/drain regions than the device in FIGS. 1-11. As noted in connection with FIG. 9, the device in FIG. 12 is a relatively longer channel FET having wider source/drain regions 240', wider replacement gate structures 245 and wider nanosheet stacks. The device in FIG. 12 is manufactured using the same or similar methods as/to the device in FIGS. 1-11, and similar reference numerals denote the same or similar components. For example, like the device in FIG. 11, the device in FIG. 12 includes a substrate 201, an isolation layer 215, silicon nanosheets or nanowires 207a-c, spacer layers 213, inner spacers 220, source/drain regions 240', profile portions 241, replacement gate structures 245, SAC layer 250 and source/drain contacts 255. Due to the wider source/drain regions 240' than those of the device in FIG. 11, and wider pillar portions (not shown) than what is shown in FIG. 9, after removal of pillar portions by isotropic etching, the profile portions 241 are different from the profile portions 141. The profile portions 241 have a flatter top surface, and have a greater height than those of the profile portions 141. Similar to the profile portions 141, the profile portions 241 include a central portion having a greater height than that of portions on opposite sides of the central portion.

In order to compensate for the pillar portions of the FIG. 12 device having a greater lateral width (e.g., about 20 nm), the pillar portions for the FIG. 12 device have greater vertical heights (e.g., about 30 nm-about 40 nm) than those of the pillar portions P so that the pillar portions for the FIG. 12 device can be removed by an isotropic etch similarly to the pillar portions P for the FIG. 11 device, and result in patterned source/drain regions 240' having uniform heights with respect to each other.

For ease of explanation, one nanosheet/gate structure stack is shown in FIG. 12. However, the embodiments are not limited thereto, and more than one nanosheet/gate structure stack can be formed on a substrate 201.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
    forming a plurality of semiconductor layers on a semiconductor substrate;
    forming a plurality of gate structures spaced apart from each other on the semiconductor layers;
    patterning the semiconductor layers into a plurality of patterned stacks spaced apart from each other, wherein the plurality of patterned stacks are under the plurality of gate structures;
    forming a plurality of sacrificial spacers on lateral sides of the plurality of gate structures;
    growing a plurality of source/drain regions, wherein the plurality of source/drain regions are adjacent the plurality of patterned stacks and include a plurality of pillar portions formed on lateral sides of the plurality of sacrificial spacers;
    selectively removing the plurality of sacrificial spacers; and
    removing the plurality of pillar portions.

2. The method according to claim 1, wherein heights of the plurality of pillar portions are greater than widths of the plurality of pillar portions.

3. The method according to claim 2, wherein the removing the plurality of pillar portions comprises isotropically etching the plurality of pillar portions.

4. The method according to claim 1, further comprising forming a sacrificial layer on the semiconductor substrate adjacent the plurality of patterned stacks, wherein the plurality of sacrificial spacers are formed on the sacrificial layer.

5. The method according to claim 4, wherein the sacrificial layer comprises an organic planarization layer.

6. The method according to claim 4, further comprising removing the sacrificial layer prior to growing the plurality of source/drain regions.

7. The method according to claim 4, wherein the sacrificial layer has a height less than a height of the plurality of gate structures.

8. The method according to claim 1, wherein the plurality of pillar portions have different heights from each other.

9. The method according to claim 1, wherein the plurality of pillar portions have the same or substantially the same width as each other.

10. The method according to claim 1, wherein the plurality of source/drain regions have the same or substantially the same height as each other following the removing of the plurality of pillar portions.

11. The method according to claim 1, wherein the removing the plurality of pillar portions forms a curved upper surface of the plurality of source/drain regions.

12. The method according to claim 1, further comprising:
selectively removing a plurality of sacrificial semiconductor layers of the plurality of semiconductor layers from the plurality of patterned stacks; and
replacing the removed plurality of sacrificial semiconductor layers with respective replacement gate structures.

13. The method according to claim 1, further comprising replacing the plurality of gate structures with a plurality of replacement gate structures.

14. A method for manufacturing a semiconductor device, comprising:
forming a plurality of first semiconductor layers and a plurality of second semiconductor layers on a semiconductor substrate in a stacked configuration comprising a repeating arrangement of a second semiconductor layer stacked on a first semiconductor layer;
forming a plurality of gate structures spaced apart from each other on the stacked configuration;
patterning the stacked configuration into a plurality of patterned stacks spaced apart from each other, wherein the plurality of patterned stacks are under the plurality of gate structures;
forming a plurality of sacrificial spacers on lateral sides of the plurality of gate structures;
growing a plurality of source/drain regions from the plurality of second semiconductor layers, wherein the plurality of source/drain regions are adjacent the plurality of patterned stacks and include a plurality of pillar portions formed on lateral sides of the plurality of sacrificial spacers;
selectively removing the plurality of sacrificial spacers; and
removing the plurality of pillar portions.

15. The method according to claim 14, wherein heights of the plurality of pillar portions are greater than widths of the plurality of pillar portions.

16. The method according to claim 14, wherein the plurality of pillar portions have different heights from each other.

17. The method according to claim 14, wherein the plurality of pillar portions have the same or substantially the same width as each other.

* * * * *